United States Patent
Park et al.

(10) Patent No.: US 9,543,367 B2
(45) Date of Patent: Jan. 10, 2017

(54) ORGANIC LIGHT EMITTING DISPLAY DEVICES

(71) Applicant: Samsung Display Co., LTD., Yongin, Gyeonggi-Do (KR)

(72) Inventors: Sang-Ho Park, Suwon-si (KR); Seung-Min Lee, Jeju-si (KR); Joo-Sun Yoon, Seoul (KR); Kwang-Young Choi, Incheon (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/737,177

(22) Filed: Jun. 11, 2015

(65) Prior Publication Data
US 2016/0005802 A1 Jan. 7, 2016

(30) Foreign Application Priority Data
Jul. 4, 2014 (KR) .................. 10-2014-0083590

(51) Int. Cl.
*H01L 27/32* (2006.01)

(52) U.S. Cl.
CPC ....... *H01L 27/3265* (2013.01); *H01L 27/3248* (2013.01); *H01L 2227/323* (2013.01); *H01L 2251/5323* (2013.01)

(58) Field of Classification Search
CPC .. H01L 27/32; H01L 27/3265; H01L 27/3248; H01L 27/3262; H01L 27/3258
See application file for complete search history.

(56) References Cited

U.S. PATENT DOCUMENTS

| | | | |
|---|---|---|---|
| 2007/0001597 A1 | 1/2007 | Yang | |
| 2011/0122330 A1 | 5/2011 | Tae et al. | |
| 2011/0163318 A1* | 7/2011 | Park | H01L 27/326 257/59 |
| 2013/0285539 A1* | 10/2013 | Kim | H05B 33/12 313/504 |
| 2013/0314453 A1 | 11/2013 | Ko | |

FOREIGN PATENT DOCUMENTS

| | | |
|---|---|---|
| KR | 10-2007-0002685 | 1/2007 |
| KR | 10-2007-0037115 | 4/2007 |
| KR | 10-1282563 | 7/2013 |

\* cited by examiner

*Primary Examiner* — Phuc Dang
(74) *Attorney, Agent, or Firm* — Innovation Counsel LLP

(57) ABSTRACT

An organic light emitting display device may have a pixel region and a transparent region, and may include a substrate, at least one semiconductor device disposed on the substrate in the pixel region, an organic light emitting structure disposed on the at least one semiconductor device, and a capacitor disposed on the substrate in the transparent region. The capacitor may have a sufficient capacitance without substantially reducing a transmittance of the organic light emitting display device. Additionally, the transparent region of the organic light emitting display device may serve as a mirror in accordance with the material included in a lower electrode of the capacitor and/or an upper electrode of the capacitor.

20 Claims, 13 Drawing Sheets

ORGANIC LIGHT EMITTING DISPLAY DEVICES

CROSS-REFERENCE TO RELATED APPLICATION(S)

This application claims priority under 35 U.S.C. §119 to Korean patent Application No. 10-2014-0083590, filed on Jul. 4, 2014, the disclosure of which is hereby incorporated by reference herein in its entirety.

BACKGROUND

1. Technical Field

Exemplary embodiments of the inventive concept relate to organic light emitting display devices. More particularly, exemplary embodiments of the inventive concept relate to organic light emitting display devices including capacitors disposed on transparent regions, and method of manufacturing the organic light emitting display devices.

2. Description of the Related Art

An organic light emitting display (OLED) device may display various information such as images or characters by combining electrons provided from a cathode with holes provided from anode in an organic light emitting layer. The organic light emitting display device has been expected as one of promising next generation display devices because the organic light emitting display device has some advantages, for example, a wide view angle, a rapid response speed, a thin thickness, a low power consumption, etc.

Recently, a transparent organic light emitting display device has been rapidly developed. In the transparent organic light emitting display device, an image of an object in the front or the back of a transparent region of the organic light emitting display device may be recognized when the organic light emitting display device is in an "ON" state. In an "OFF" state of the organic light emitting display device, an image may be displayed in a pixel region of the organic light emitting display device using light generated from an organic light emitting layer.

Generally, the transparent organic light emitting display device includes a substrate having a pixel region in which pixels are arranged and a transparent region adjacent to the pixel region, semiconductor devices disposed in the pixel region, a capacitor disposed in the pixel region, peripheral circuits, etc. In the conventional transparent organic light emitting display device, the semiconductor devices and the capacitor are positioned in the pixel region. Here, the capacitor may not have enough area to provide a sufficient capacitance for other elements of the organic light emitting display device.

SUMMARY

Exemplary embodiments provide an organic light emitting display device including a capacitor of a sufficient capacitance disposed in a transparent region without reducing a transmittance of the organic light emitting display device.

According to aspects of the inventive concept, there is provided an organic light emitting display device having a pixel region and a transparent region. The organic light emitting display device may include a substrate, at least one semiconductor device disposed on the substrate in the pixel region, an organic light emitting structure disposed on the at least one semiconductor device, and a capacitor disposed on the substrate in the transparent region.

In exemplary embodiments, the at least one semiconductor device may include a first semiconductor device. The first semiconductor device may include a first active pattern disposed on the substrate, a first gate insulation layer disposed on the first active pattern, a first gate electrode disposed on the first gate insulation layer, a first source electrode contacting a first portion of the first active pattern and having an extended portion extending into the transparent region, and a first drain electrode contacting a second portion of the first active pattern. Further, the capacitor may include a lower electrode contacting the extended portion of the first source electrode, a dielectric structure disposed on the lower electrode, and an upper electrode disposed on the dielectric structure. For example, each of the lower electrode and the upper electrode may include a material having a transmittance or a material having a reflectivity.

In exemplary embodiments, the lower electrode and the first gate electrode are disposed on a same plane and formed of a same material. Additionally, the dielectric structure may include a first insulating interlayer disposed on the first gate electrode and the lower electrode, and a second insulating interlayer disposed on the first insulating interlayer.

In exemplary embodiments, the organic light emitting display device may additionally include an insulation layer disposed on the capacitor and the at least one semiconductor device. Here, the organic light emitting structure may be positioned on the insulation layer.

In exemplary embodiments, the insulation layer may have an opening exposing the dielectric structure in the transparent region, and a contact hole exposing the extended portion of the first source electrode in the pixel region. The upper electrode may be disposed on the dielectric structure exposed by the opening, the insulation layer and a sidewall of the opening. Further, the organic light emitting structure may include a first electrode contacting the exposed portion of the first source electrode through the contact hole, an organic light emitting layer disposed on the first electrode, and a second electrode disposed on the organic light emitting layer. 11. Alternatively, the upper electrode may be integrally formed with the first electrode. 12.

In some exemplary embodiments, the insulation layer may have an opening exposing the exposed portion of the first source electrode and the dielectric structure. The upper electrode may be positioned on the insulation layer, one sidewall of the opening and the dielectric structure exposed by the opening. Further, the organic light emitting structure may include a first electrode disposed on the insulation layer, another sidewall of the opening and the exposed portion of the first source electrode, an organic light emitting layer disposed on the first electrode, and a second electrode disposed on the organic light emitting layer.

In exemplary embodiments, the at least one semiconductor device may include a second semiconductor device. The second semiconductor device may include a second active pattern disposed on the substrate, the first gate insulation layer disposed on the second active pattern, a second gate electrode disposed in the first gate insulation layer, a second source electrode contacting a first portion of the second active pattern, and a second drain electrode contacting a second portion of the second active pattern. The second gate electrode and the lower electrode may be positioned respectively at different levels over the substrate.

In exemplary embodiments, the organic light emitting display device may additionally include an additional capacitor disposed in the pixel region. For example, the additional capacitor may be disposed on the first semiconductor device. The additional capacitor may include a lower electrode being the first gate electrode, a dielectric structure disposed on the first gate electrode, and an upper electrode disposed on the dielectric structure. Here, the dielectric structure of the additional capacitor may include a portion of an insulating interlayer disposed on the first gate electrode.

In exemplary embodiments, the capacitor may include a lower electrode, a dielectric structure disposed on the lower electrode, and an upper electrode disposed on the dielectric structure and contacting the extended portion of the first source electrode. The upper electrode may be formed using the same material as that of an electrode of the organic light emitting structure. The organic light emitting display device may further include an additional capacitor disposed in the pixel region. The additional capacitor may be disposed on the first semiconductor device. The additional capacitor may include a lower electrode being the first gate electrode, a dielectric structure disposed on the first gate electrode, and an upper electrode disposed on the dielectric structure. The dielectric structure of the additional capacitor may include an insulating interlayer disposed on the first gate electrode, According to exemplary embodiments of the inventive concept, the organic light emitting display device may include the capacitor disposed in the transparent region of the organic light emitting display device without increasing an area of the pixel region. Thus, the capacitor may have a sufficient capacitance for elements of the organic light emitting display device while a transmittance of the organic light emitting display device may not substantially reduced. Further, the transparent region of the organic light emitting display device may function as a mirror in accordance when the lower electrode of the capacitor and/or the upper electrode of the capacitor may include the material having the reflectivity. Moreover, the organic light emitting display device may include the additional capacitor disposed in the pixel region, so the organic light emitting display device may have ensure a more sufficient capacitance for the element thereof.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EMBODIMENTS

Hereinafter, organic light emitting display devices and methods of manufacturing organic light emitting display devices in accordance with exemplary embodiments will be described in detail with reference to the accompanying drawings.

Figure 1:
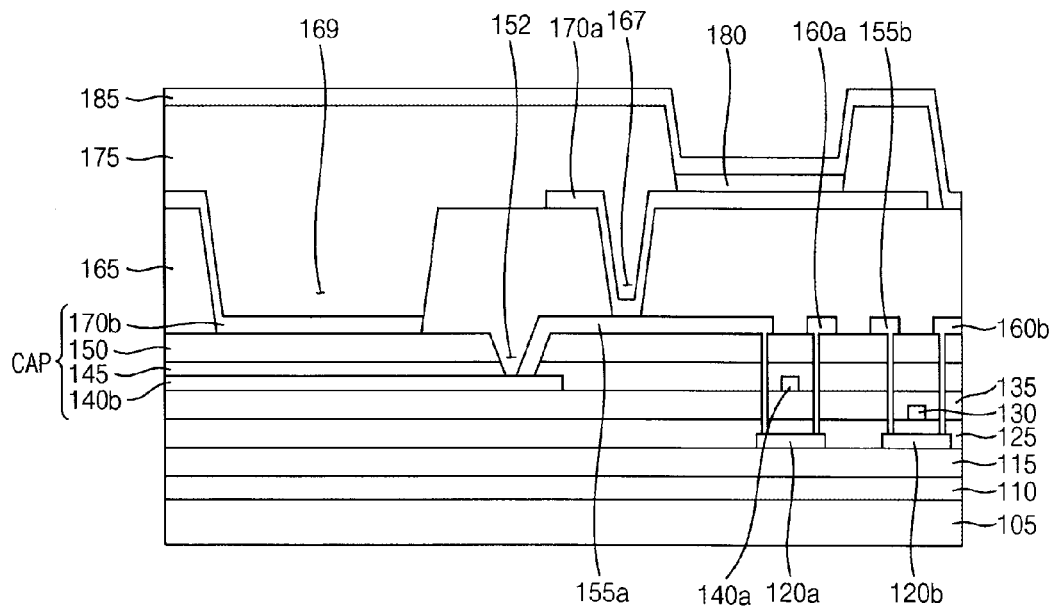
FIG. 1 is a cross sectional view illustrating an organic light emitting display device in accordance with exemplary embodiments.

FIG. 1 is a cross sectional view illustrating an organic light emitting display device in accordance with exemplary embodiments.

Referring to FIG. 1, an organic light emitting display device 100 includes a substrate 105, a first semiconductor device, a second semiconductor device, a capacitor CAP, an organic light emitting structure, etc. In exemplary embodiments, the organic light emitting display device 100 may have a pixel region and a transparent region. The first and the second semiconductor devices and the organic light emitting structure may be disposed in the pixel region, while the capacitor CAP may be located in the transparent region of the organic light emitting display device 100. For example, an image may be displayed using the organic light emitting structure located in the pixel region of the organic light emitting display device 100, and an image of an object positioned in the front and/or the back of the transparent region of the organic light emitting display device 100 may be recognized. In exemplary embodiments, the capacitor CAP located in the transparent region may include a lower electrode 140b, a dielectric structure and an upper electrode 170b.

The substrate 105 may include a transparent insulation material. For example, the substrate 105 may include a glass substrate, a quartz substrate, a transparent resin substrate, etc. Examples of the transparent resin substrate may include polyimide-based resin, acryl-based resin, polyacrylate-based resin, polycarbonate-based resin, polyether-based resin, sulfonic acid-based resin, polyethylene terephthalate-based resin, etc. The substrate 105 may also have the pixel region and the transparent region in accordance with the organic light emitting display device 100.

A first buffer layer 110 and a second buffer layer 115 may be disposed on the substrate 105. The first and the second buffer layers 110 and 115 may prevent the diffusion of metal atoms and/or impurities from the substrate 105. Additionally, the first and the second buffer layers 110 and 115 may control the rate of the heat transfer in the crystallization process for forming a first active pattern 120a and a second active pattern 120b, thereby obtaining substantially uniform the first and the second active patterns 120a and 120b. Furthermore, the first and the second buffer layers 110 and 115 may improve the surface flatness of the substrate 105 when the surface of the substrate 105 may be relatively irregular. For example, each of the first and the second buffer layers 110 and 115 may include silicon nitride, silicon oxide, etc. In some exemplary embodiments, only one buffer layer or no buffer layer may be provided on the substrate 105 in accordance with the type of the substrate 105.

The first semiconductor device may be disposed on the second buffer layer 115. In exemplary embodiments, the first semiconductor device may include a first active pattern 120a, a first gate insulation layer 125, a second gate insulation layer 135, a first gate electrode 140a, a first source electrode 155a, and a first drain electrode 160a. A first insulating interlayer 145 and a second insulating interlayer 150 may be disposed between the first gate electrode 140a and the first source/drain electrode 155a/160a. For example, the first semiconductor device may serve as a driving transistor of the organic light emitting display device 100.

The second semiconductor device may also be disposed on the second buffer layer 115. The second semiconductor device may include a second active pattern 120b, the first gate insulation layer 125, a second gate electrode 130, a second source electrode 155b, and a second drain electrode 160b. The second gate insulation layer 135, the first insulating interlayer 145 and the second insulating interlayer 150 may be interposed between the second gate electrode 130 and the second source/drain electrode 155b/160b. For example, the second semiconductor device may function as a switching transistor of the organic light emitting display device 100.

According to exemplary embodiments, the first and the second semiconductor devices may be disposed in the pixel region. In these semiconductor devices, the first active pattern 120a may be spaced apart from the second active pattern 120b. That is, the first and the second active patterns 120a and 120b may be separately located on the second buffer layer 115. For example, each of the first and the second active patterns 120a and 120b may include a material containing silicon. Alternatively, the first and the second active patterns 120a and 120b may include oxide semiconductors, respectively. The first gate insulation layer 125 may be disposed on the second buffer layer 115 to cover the first and the second active patterns 120a and 120b. The first gate insulation layer 125 may include silicon oxide, metal oxide, etc.

The second gate electrode 130 may be positioned on a portion of the first gate insulation layer 125 under which the second active pattern 120b is located. The second gate electrode 130 may include metal, alloy, metal nitride, conductive metal oxide, transparent conductive material, etc. The second gate insulation layer 135 may be disposed on the first gate insulation layer 125 to cover the second gate electrode 130. The second gate insulation layer 135 may include silicon nitride, silicon oxide, metal nitride, etc.

The first gate electrode 140a is disposed on the second gate insulation layer 135. The first gate electrode 140a may include metal, alloy, metal nitride, conductive metal oxide, transparent conductive material, etc. For example, the first gate electrode 140a may include aluminum (Al), alloy containing aluminum, aluminum nitride (AlNx), silver (Ag), alloy containing silver, tungsten (W), tungsten nitride (WNx), copper (Cu), alloy containing copper, nickel (Ni), chromium (Cr), molybdenum (Mo), alloy containing molybdenum, titanium (Ti), titanium nitride (TiNx), platinum (Pt), tantalum (Ta), tantalum nitride (TaNx), zinc oxide (ZOx), indium tin oxide (ITO), tin oxide (SnOx), indium oxide (InOx), gallium oxide (GaOx), indium zinc oxide (IZO), etc. The first and the second gate insulation layers 125 and 135 may be interposed between the first active pattern 120a and the first gate electrode 140a, while the first gate insulation layer 125 may be interposed between the second active pattern 120b and the second gate electrode 130. In exemplary embodiments, the first gate electrode 140a may be positioned at a level different from that of the second gate electrode 130. That is, the first and the second gate electrodes 140a and 130 may be located respectively at different levels over the substrate 105.

As illustrated in FIG. 1, the first and the second gate electrodes 140a and 130 may be positioned in the pixel region, and the lower electrode 140b of the capacitor CAP may be located in the transparent region. Thus, the lower electrode 140b is spaced apart from the first gate electrode 140a on the second gate insulation layer 135. In exemplary embodiments, the lower electrode 140b may include a material substantially the same as that of the first gate electrode 140a. For example, each of the first gate electrode 140a and the lower electrode 140b may include a material having a transmittance. Examples of the material having the transmittance may include indium tin oxide, indium zinc oxide, zinc oxide, tin oxide, gallium oxide, indium oxide, etc. Alternatively, the first gate electrode 140a may include a material different from that of the lower electrode 140b. When the lower electrode 140b include the above material having the transmittance, the transmittance of the organic light emitting display device 100 may not be reduced even though the capacitor CAP is positioned in the transparent region.

In some exemplary embodiments, the lower electrode 140b may include a material having a reflectivity or a semi-transparent material. For example, the lower electrode 140b may include aluminum, alloy containing aluminum, aluminum nitride, silver, alloy containing silver, tungsten, tungsten nitride, copper, alloy containing copper, nickel, chromium, molybdenum, alloy containing molybdenum, titanium, titanium nitride, platinum, tantalum, tantalum nitride, etc. When the lower electrode 140b of the capacitor CAP includes the material having the reflectivity or the semi-transparent material, the transparent region of the organic light emitting display device 100 may substantially function as a mirror.

Referring now to FIG. 1, the first insulating interlayer 145 may be disposed on the second gate insulation layer 135 to cover the first gate electrode 140a and the lower electrode 140b. The first insulating interlayer 145 may electrically insulate the first gate electrode 140a from the first source and drain electrodes 155a and 160a in the pixel region. In the transparent region, the first insulating interlayer 145 may compose the dielectric structure of the capacitor CAP. For example, the first insulating interlayer 145 may include silicon compound such as silicon oxide, silicon nitride, silicon oxy-nitride, silicon carbon nitride, silicon oxy-carbide, etc.

The second insulating interlayer 150 may be disposed on the first insulating interlayer 145. In the pixel region, the first and the second insulating interlayers 145 and 150 may electrically insulate the first gate electrode 140a from the first source and drain electrodes 155a and 160a, and also may electrically insulate the second gate electrode 130 from the second source and drain electrodes 155b and 160b. In the transparent region, the first insulating interlayer 145 and the second insulating layer may compose the dielectric structure of the capacitor CAP. That is, the dielectric structure of the capacitor CAP may include the first and the second insulating interlayers 145 and 150. For example, the second insulating interlayer 150 may include silicon compound such as silicon oxide, silicon nitride, silicon oxy-nitride, silicon carbon nitride, silicon oxy-carbide, etc.

As illustrated in FIG. 1, the first source electrode 155a and the first drain electrode 160a may contact a first source region and a first drain region of the first active pattern 120a via the second insulating interlayer 150, the first insulating interlayer 145, the second gate insulation layer 135 and the first gate insulation layer 125, respectively. Additionally, the second source electrode 155b and the second drain electrode 160b may contact a second source region and a second drain region of the second active pattern 120b via the second insulating interlayer 150, the first insulating interlayer 145, the second gate insulation layer 135 and the first gate insulation layer 125, and then may contact a second source region and a second drain region of the second active pattern 120b, respectively.

According to exemplary embodiments, the first source electrode 155a may extend into the transparent region, and may contact the lower electrode 140b of the capacitor CAP. For example, a first contact hole 152 exposing the lower electrode 140b may be provided through the first and the second insulating interlayers 145 and 150, and the first source electrode 155a may extend onto the lower electrode 140b through the first contact hole 152.

Each of the first and the second source electrodes 155a and 155b may include metal, alloy, metal nitride, conductive metal oxide, transparent conductive material, etc. Further, each of the first and the second drain electrodes 160a and 160b may include metal, alloy, metal nitride, conductive metal oxide, transparent conductive material, etc. For example, each of the first and the second source electrodes 155a and 155b and the first and the second drain electrodes 160a and 160b may include aluminum, alloy containing aluminum, aluminum nitride, silver, alloy containing silver, tungsten, tungsten nitride, copper, alloy containing copper, nickel, chromium, molybdenum, alloy containing molybdenum, titanium, titanium nitride, platinum, tantalum, tantalum nitride, zinc oxide, indium tin oxide, tin oxide, indium oxide, gallium oxide, indium zinc oxide, etc.

In exemplary embodiments, the first gate electrode 140a of the first semiconductor device may be positioned at a level substantially the same as that of the lower electrode 140b of the capacitor CAP. In contrast, the second gate electrode 130 of the second semiconductor device may be located at a level substantially lower than the level of the first gate electrode 140a. As described above, the capacitor CAP may include the lower electrode 140b, the dielectric structure having the portions of the first and the second insulating interlayers 145 and 150, and the upper electrode 170b. The upper electrode 170b of the capacitor CAP will be described below.

The insulation layer 165 may be disposed on the second insulating interlayer 150 to cover the first and the second source electrodes 155a and 155b and the first and the second drain electrodes 160a and 160b. In exemplary embodiments, the insulation layer 165 may cover the first and the second semiconductor devices in the pixel region, and may extend into the transparent region. A second contact hole 167 may be provided through a portion of the insulation layer 165 adjacent to a boundary between the pixel region and the transparent region. The second contact hole 167 may expose an extended portion of the first source electrode 155a near the boundary between the pixel region and the transparent region. An opening 169 may be provided through the insulation layer 165 to expose the second insulating interlayer 150 in the transparent region. For example, the opening 169 may be spaced apart from the second contact hole 167. The first contact hole 152 may be disposed between the opening 169 and the second contact hole 167 in a plan view. The insulation layer 165 may include an organic material. For example, the insulation layer 165 may include photoresist, acryl-based resin, polyimide-based resin, polyamide-based resin, siloxane-based resin, etc. Alternatively, the insulation layer 165 may include an inorganic material such as silicon compound, metal, metal oxide, etc.

Referring now to FIG. 1, the first electrode 170a and the upper electrode 170b may be disposed on the insulation layer 163 and an exposed portion of the second insulating interlayer 150. In the pixel region, the first electrode 170a may extend from the insulation layer 162 into the second contact hole 167 to thereby contact the exposed portion of the first source electrode 155a. In the transparent region, the upper electrode 170b may extend from the insulation layer 165 into the opening 169 so that the upper electrode 170b may be positioned on the exposed second insulating interlayer 150.

Each of the first electrode 170a and the upper electrode 170b may include a material having a transmittance. For example, the first electrode 170a and the upper electrode 170b may include indium tin oxide, indium zinc oxide, zinc oxide, tin oxide, gallium oxide, indium oxide, etc. When the upper electrode 170b of the capacitor CAP includes the material having the transmittance, the transmittance of the organic light emitting display device 100 may not be decreased in the transparent region.

In some exemplary embodiments, each of the first electrode 170a and the upper electrode 170b may include a material having a reflectivity. For example, the first electrode 170a and the upper electrode 170b may include metal, alloy, metal nitride, etc. Examples of the material having the reflectivity may include aluminum, alloy containing aluminum, aluminum nitride, silver, alloy containing silver, tungsten, tungsten nitride, copper, alloy containing copper, nickel, chromium, molybdenum, alloy containing molybdenum, titanium, titanium nitride, platinum, tantalum, tantalum nitride, etc. In case that the upper electrode 1670b of the capacitor CAP includes the material having the reflectivity, the transparent region of the organic light emitting display device 100 may substantially serve as a mirror.

A pixel defining layer 175 may be disposed on the first electrode 170a, the upper electrode 170b and the insulation layer 162. The pixel defining layer 175 may include an organic material or an inorganic material. For example, the pixel defining layer 175 may include photoresist, polyamide-based resin, polyimide-based resin, acryl-based resin, silicon compound, etc. In the pixel region, a pixel opening may be provided through the pixel defining layer 175 to partially expose the first electrode 170a.

An organic light emitting layer 180 of the organic light emitting structure may be disposed on the exposed first electrode 170a through the pixel opening of the pixel defining layer 175. In exemplary embodiments, the organic light emitting layer 180 may have a multi-layered configuration that includes an organic light emitting layer (EL), a hole injection layer (HIL), a hole transfer layer (HTL), an electron transfer layer (ETL), an electron injection layer (EIL), etc. The organic light emitting layer 180 may include a light emitting material for generating a red color of light, a green color of light or a blue color of light in accordance with the pixels of the organic light emitting display device 100. Alternatively, the organic light emitting layer 180 may include a plurality of materials for generating a red color of light, a green color of light and/or a blue color of light, thereby finally emitting a white color of light.

The second electrode 185 may be disposed on the pixel defining layer 175 and the organic light emitting layer 180. The second electrode 185 may include a material having a transmittance or a reflectivity in accordance with the type of the organic light emitting display device 100. Although it is not illustrated in FIG. 1, an additional substrate, an encapsulation substrate and/or a window may be disposed on the second electrode 185. For example, the additional substrate may include a glass substrate, a quartz substrate, a transparent resin substrate, etc.

As described above, the organic light emitting structure, the first semiconductor device and the second semiconductor device may be positioned in the pixel region of the organic light emitting display device 100. The capacitor CAP may be provided in the transparent region of the organic light emitting display device 100.

In the conventional organic light emitting display device, all of the semiconductor device and the capacitor are disposed on the substrate in the pixel region, so that the capacitance of the capacitor for the elements of the conventional organic light emitting display device may not be sufficiently ensured due to the limited size of the pixel region. According to exemplary embodiments of the inventive concept, when each of the lower electrode 140b and the upper electrode 170b includes the material having the transmittance, the transmittance of the organic light emitting display device 100 may not be substantially decreased even though the capacitor CAP is positioned in the transparent region. Moreover, the capacitor CAP may ensure a sufficient capacitance for the elements of the organic light emitting display device 100 without increasing the area of the pixel region. For example, the capacitor CAP of the exemplary embodiments may have an increased capacitance larger than that of the conventional capacitor by about 1.5 times. According to some exemplary embodiments, the transparent region of the organic light emitting display device 100 may serve as a mirror device when the lower electrode 140b and/or the upper electrode 170b may include the material having the reflectivity.

Figure 2:
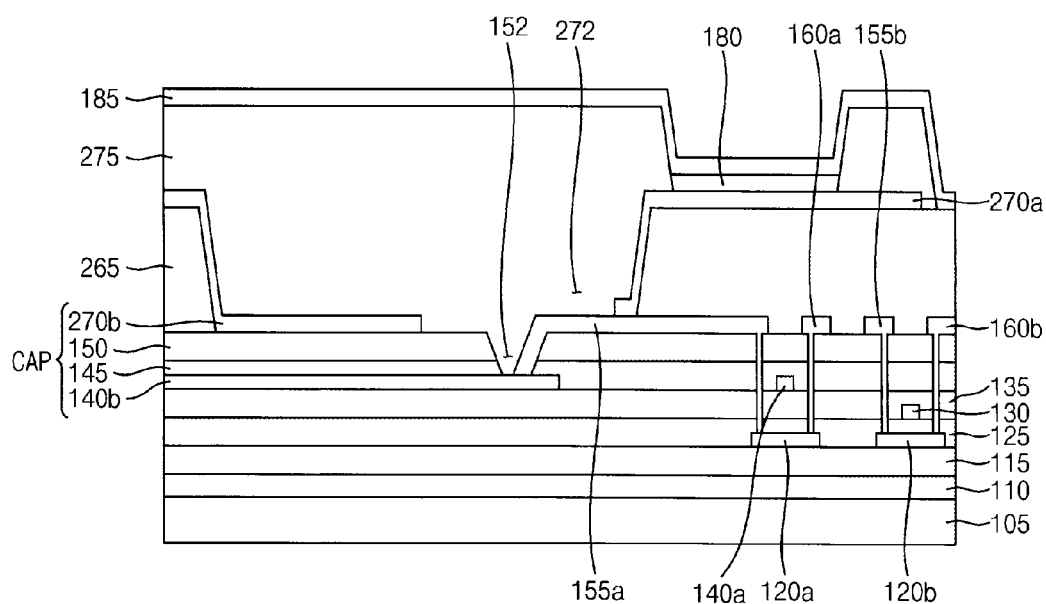
FIG. 2 is a cross sectional view illustrating an organic light emitting display device in accordance with some exemplary embodiments.

FIG. 2 is a cross sectional view illustrating an organic light emitting display device in accordance with some exemplary embodiments. An organic light emitting display device 200 in FIG. 2, the same reference numerals are used for elements substantially the same as those of the organic light emitting display device 100 described with reference to FIG. 1, and detailed descriptions for those elements will be omitted.

Referring to FIG. 2, an insulation layer 265 may be disposed in the second insulating interlayer 150 to cover the first and the second source electrodes 155a and 155b and the first and the second drain electrodes 160a and 160b. In exemplary embodiments, the insulation layer 265 may have an opening 272 extending from the pixel region into the transparent region of the organic light emitting display device 200. This opening 272 may expose the extended portion of the first source electrode 155a, a portion of a first electrode 270a and an upper electrode 270b. The first electrode 270a may extend onto the extended portion of the first source electrode 155a through one sidewall of the opening 272. Hence, the first electrode 270a may contact the first source electrode 155a. When the insulation layer 265 has the opening 272 having a relatively large area without the second contact hole 167 illustrated in FIG. 1, the transparent region of the organic light emitting display device 200 may be enlarged by the area of the second opening 167, so that the organic light emitting display device 200 may have a substantially increased transmittance.

As illustrated in FIG. 2, the first electrode 270a may extend form the insulation layer 265 in the pixel region onto the first source electrode 155a through one sidewall of the opening 272. The upper electrode 270b may extend from the insulation layer 265 in the transparent region onto the second insulating interlayer 150 through another sidewall of the opening 272. The first electrode 270a and the upper electrode 270b may be spaced apart from each other. The first contact hole 152 may be disposed between the first electrode 270a contacting the first source electrode 155a and the upper electrode 270b.

In exemplary embodiments, each of the lower electrode 140a and the upper electrode 270b of the capacitor CAP may include a material having a transmittance (e.g., a transparent conductive material), such that the capacitor CAP may have sufficiently increased capacitance in the transparent region without substantially reducing the transmittance of the organic light emitting display device 200. Furthermore, the opening 272 having the relatively large area may be provided in the transparent region, so that the organic light emitting display device 200 may have more increased transmittance.

In some exemplary embodiments, the lower electrode 140b and/or the upper electrode 270b may include a material having a reflectivity. In this case, the transparent region of the organic light emitting display device 200 may substantially function as a mirror, so that the organic light emitting display device may serve as a mirror display device while ensuring the enhanced capacitance of the capacitor CAP.

Figure 3:
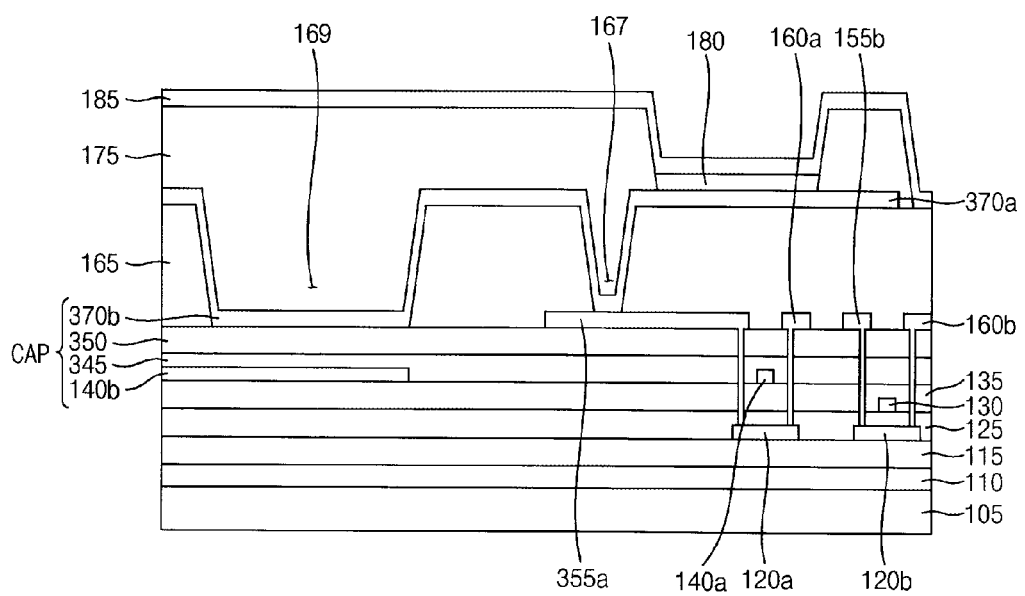
FIG. 3 is a cross sectional view illustrating an organic light emitting display device in accordance with some exemplary embodiments.

FIG. 3 is a cross sectional view illustrating an organic light emitting display device in accordance with some exemplary embodiments. An organic light emitting display device 300 in FIG. 3, the same reference numerals are used for elements substantially the same as those of the organic light emitting display device 100 described with reference to FIG. 1.

Referring to FIG. 3, the second contact hole 167 may be provided through the insulation layer 165 in the pixel region of the organic light emitting display device 300, and the opening 167 may be provided through the insulation layer 165 in the transparent region, as similar to that of FIG. 1. The opening 167 may partially expose a second insulating interlayer 350, and the second contact hole 167 may expose an extended portion of a first source electrode 355a. The first source electrode 355a of the first semiconductor device may extend toward the transparent region on the second insulating interlayer 350, and a first electrode 370a of an organic light emitting structure may extend into the second contact hole 167 to make contact with the first source electrode 355a.

In the organic light emitting display device illustrated in FIG. 3, the lower electrode 140b of the capacitor CAP may not be connected to the first source electrode 355a of the first semiconductor device. Further, an upper electrode 370b of the capacitor CAP may be integrally formed with the first electrode 370a of the organic light emitting structure. The upper electrode 370b and the first electrode 370a may be formed of the same material and in the same plane. Thus, it is not required an etching process for separating the first electrode 370a and the upper electrode 370b. For example, the upper electrode 370b in the transparent region may be positioned on a sidewall of the opening 169, the second insulating interlayer 350 and the insulation layer 165. The first electrode 370a in the pixel region may be located on the a sidewall of the second contact hole 167, the first source electrode 355a and the insulation layer 165. Accordingly, the organic light emitting display device 300 in FIG. 3 may have a configuration substantially simpler than that of the organic light emitting display device 100 or 200 in FIG. 1 or FIG. 2.

FIGS. 4 to 11 are cross sectional views illustrating a method for manufacturing an organic light emitting display device in accordance with exemplary embodiments. The method illustrated in FIGS. 4 to 11 may provide an organic light emitting display device having a configuration substantially the same as or similar to that of the organic light emitting display device described with reference to FIG. 1, however, the organic light emitting display device 200 or 300 illustrated in FIG. 2 or FIG. 3 may be manufactured by obviously modifying some processes such as a deposition process, an etching process, etc of the method illustrated in FIGS. 4 to 11.

Figure 4:
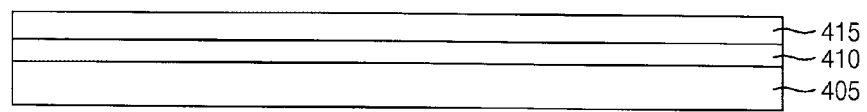
FIGS. 4, 5, 6, 7, 8, 9, 10, and 11 are cross sectional views illustrating a method of manufacturing an organic light emitting display device in accordance with exemplary embodiments.

Referring to FIG. 4, a first buffer layer 410 and a second buffer layer 415 may be sequentially formed on a substrate 405. For example, the substrate 405 may include a glass substrate, a transparent plastic substrate, a transparent metal oxide substrate, etc. The first and the second buffer layers 410 and 415 may prevent the diffusion of metal atoms and/or impurities from the substrate 405, and also may improve the surface flatness of the substrate 405. The first buffer layer 410 may be formed of a material different from that of the second buffer layer 415. For example, the first buffer layer 410 may be formed of silicon nitride while the second buffer layer 415 may be formed of silicon oxide. Alternatively, the first and the second buffer layers 410 and 415 may be formed of the same material. Further, a process for forming the first buffer layer 410 and/or a process for forming the second buffer layer 415 may be omitted in accordance with the material and/or the surface condition of the substrate 405.

Figure 5:
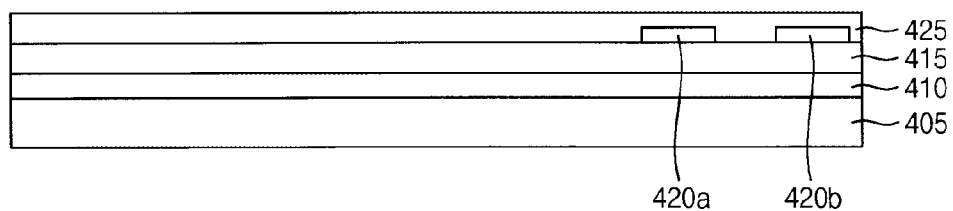

Referring to FIG. 5, after an active layer (not illustrated) may be formed on the second buffer layer 415, the active layer may be patterned to obtain a first active pattern 420a of a first semiconductor device and a second active pattern 420b of a second semiconductor device. For example, the active layer may be formed using a material containing silicon or oxide semiconductor. The first and the second active patterns 420a and 420b may be separated from each other on the second buffer layer 415.

A first gate insulation layer 425 may be formed on the second buffer layer 415 to cover the first and the second active patterns 420a and 420b. For example, the first gate insulation layer 425 may be formed of silicon compound, metal oxide, etc.

Figure 6:
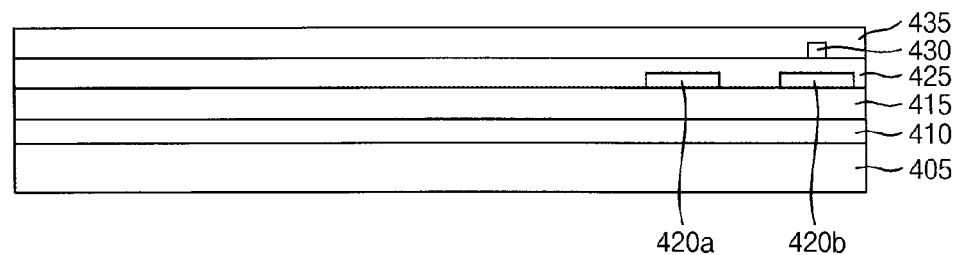

Referring to FIG. 6, a second gate electrode 430 of a second semiconductor device may be formed on the first gate insulation layer 425. For example, the second gate electrode 430 may be formed of metal, alloy, metal nitride, conductive metal oxide, transparent conductive material, etc. The second gate electrode 430 may be located over the second active pattern 420b.

A second gate insulation layer 435 may be formed on the first gate insulation layer 425 to cover the second gate electrode 430. The second gate insulation layer 435 may be formed of silicon compound, metal oxide, etc.

Figure 7:
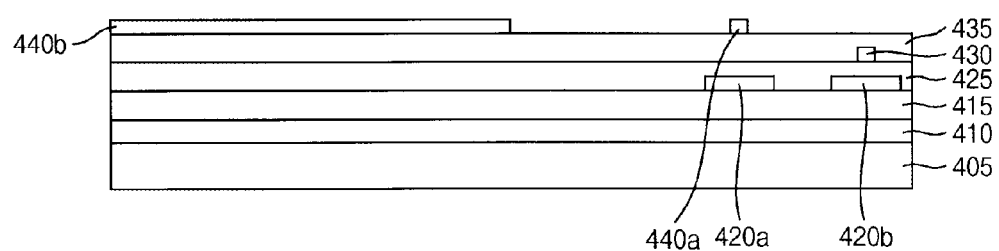
Figure 10:
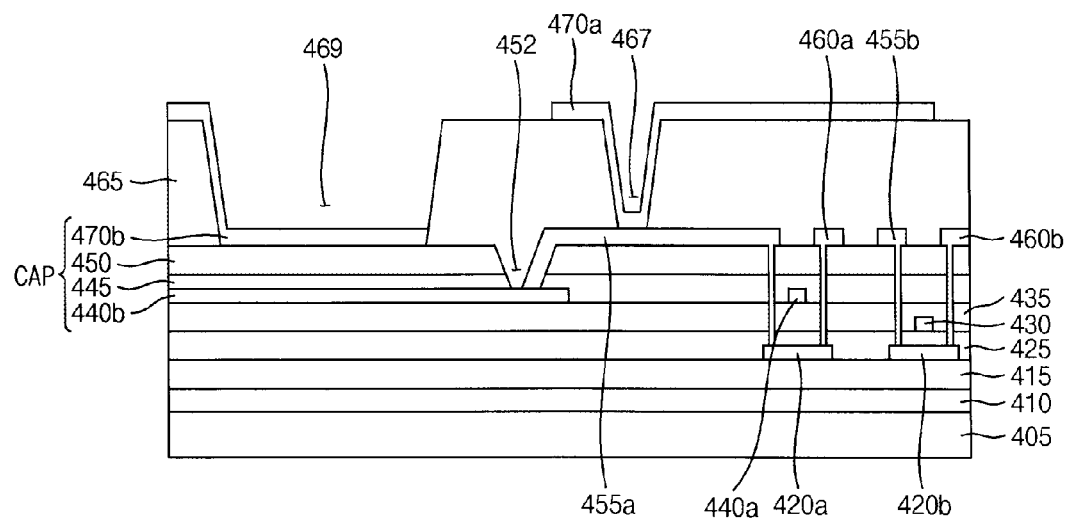

Referring to FIG. 7, a conductive layer (not illustrated) may be formed on the second gate insulation layer 435, and then the conductive layer may be patterned to obtain a first gate electrode 440a of the first semiconductor device and a lower electrode 440b of a capacitor CAP (see FIG. 10). The conductive layer may be formed of a material having a transmittance or a reflectivity.

In exemplary embodiments, the first gate electrode 440a and the lower electrode 440b may be simultaneously formed using an etching process using one mask. The first gate electrode 440a may be formed in the pixel region of the organic light emitting display device, and the lower electrode 440b may be formed in the transparent region of the organic light emitting display device. The first gate electrode 440a may be disposed over the first active pattern 420a.

Figure 8:
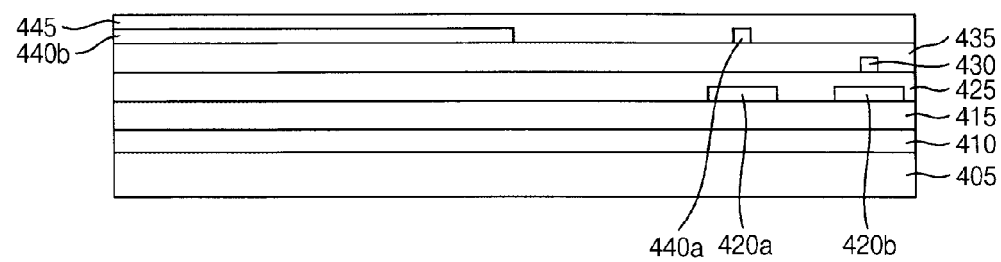

Referring to FIG. 8, a first insulating interlayer 445 may be formed on the second gate insulation layer 435 to cover the first gate electrode 440a and the lower electrode 440b. The first insulating interlayer 445 may have a substantially planar surface. For example, the first insulating interlayer 445 may be formed using silicon oxide, silicon nitride, silicon oxy-nitride, silicon oxy-carbide, silicon carbon nitride, etc.

Figure 9:
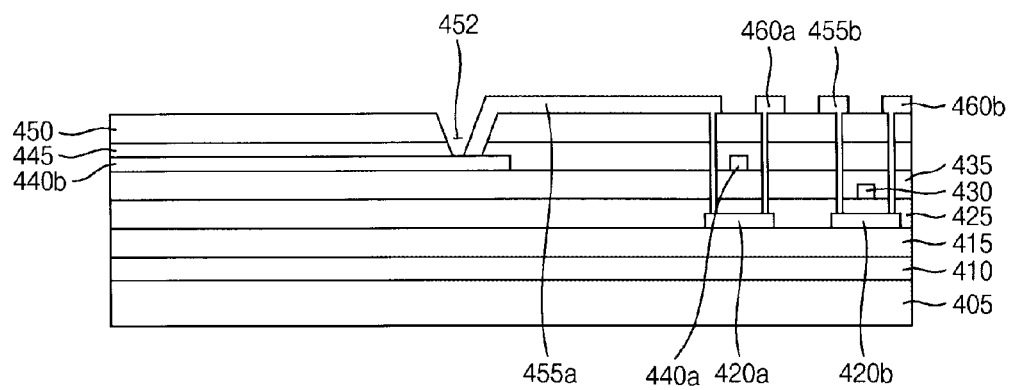

Referring to FIG. 9, a second insulating interlayer 450 may be formed on the first insulating interlayer 445. For example, the second insulating interlayer 450 may be formed of silicon oxide, silicon nitride, silicon oxy-nitride, silicon oxy-carbide, silicon carbon nitride, etc.

The first and the second insulating interlayers 445 and 450 may be partially removed in the transparent region, so that a first contact hole 452 partially exposing the lower electrode 440b may be formed through the first and the second insulating interlayers 445 and 450. In the pixel region, the first and the second insulating interlayers 445 and 450 and the first and the second gate insulation layers 425 and 435 may be partially removed to form via holes partially exposing the first and the second active patterns 420a and 420b. These via holes may expose source and drain regions of the first and the second active patterns 420a and 420b.

After an additional conductive layer (not illustrated) may be formed on the second insulating interlayer 450 to fill the via holes, the additional conductive layer may be patterned to obtain a first source electrode 455a, a first drain electrode 460a, a second source electrode 455b and a second drain electrode 460b. Hence, there is provided the first semiconductor device that includes the first active pattern 420a, the first gate insulation layer 425, the second gate insulation layer 435, the first gate electrode 440a, the first source electrode 455a and the first drain electrode 460a. Additionally, the second semiconductor device including the second active pattern 420b, the first gate insulation layer 425, the second gate electrode 430, the second source electrode 455b and the second drain electrode 460b may be provided on the substrate 405. The additional conductive layer may be formed using transparent conductive material, metal, alloy, etc. The first source and drain electrodes 455a and 460a may contact the source and the drain regions of the first active pattern 420a, and the second source and drain electrodes 455b and 460b may contact the source and the drain regions of the second active pattern 420b.

In exemplary embodiments, the first source electrode 455a may extend into the transparent region to make contact with the lower electrode 440b of the capacitor CAP. Specifically, the first source electrode 455a may extend onto the second insulating interlayer 450 and a sidewall of the first contact hole 452, and an extended portion of the first source electrode 455a may make contact with the lower electrode 440b in the transparent region.

Referring to FIG. 10, an insulation layer 465 may be formed on the second insulating interlayer 450 to cover the first and the second source electrodes 455a and 455b and the first and the second drain electrodes 460a and 460b. For example, the insulation layer 465 may be formed using photoresist, acryl-based resin, polyamide-based resin, polyimide-based resin, siloxane-based resin, etc. The insulation layer 465 may have a substantially planar surface for ease of forming overlying structures subsequently formed.

The insulation layer 465 may be partially removed in the pixel region, so that a second contact hole 467 exposing the extended portion of the first source electrode 455a may be formed through the insulation layer 465. At the same time, an opening 469 may be formed through the insulation layer 465 in the transparent region to partially expose the second insulating interlayer 450. The opening 469 in the transparent region may have an area substantially larger than that of the second contact hole 467 in the pixel region.

After an electrode layer (not illustrated) may be formed on the insulation layer 465, a bottom of the opening 469 and a sidewall of the opening 469 to fill the second contact hole 467, the electrode layer may be patterned to form a first electrode 470a of an organic light emitting structure and an upper electrode 470b of the capacitor CAP. For example, the electrode layer may be formed of a material having a transmittance or a reflectivity. In the pixel region, the first electrode 470a may be formed on the extended portion of the first source electrode 455a, a sidewall of the second contact hole 467 and the insulation layer 465. In the transparent region, the upper electrode 470b may be formed on the exposed second insulating interlayer 450, the sidewall of the opening 469 and the insulation layer 465.

In accordance with the formation of the upper electrode 470b, the capacitor CAP may be provided the transparent region. The capacitor CAP may include the lower electrode 440b, a dielectric structure having portions of the first and the second insulating interlayers 445 and 450, and the upper electrode 470b.

Figure 11:
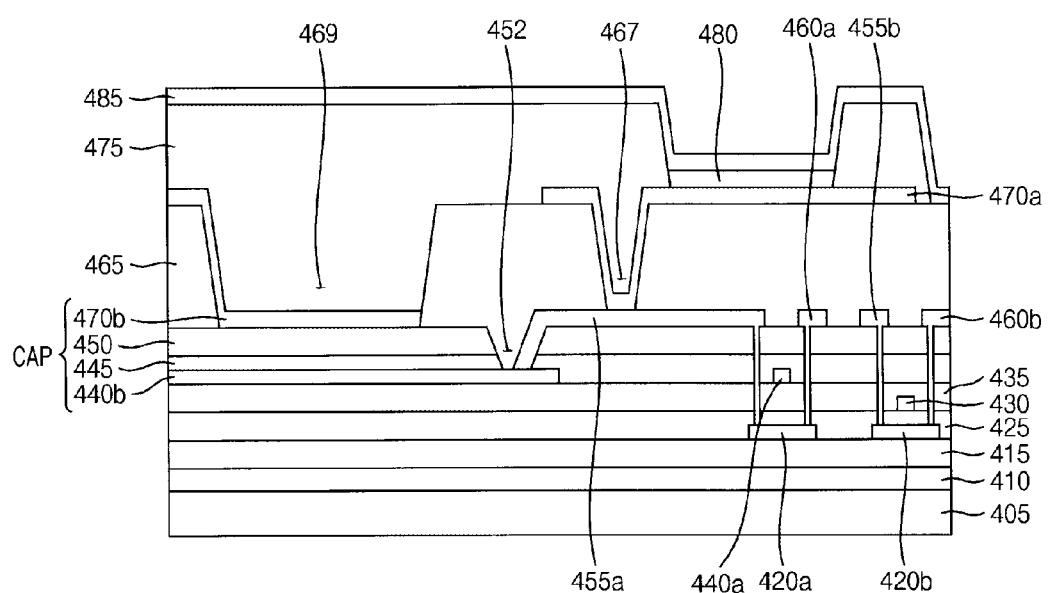

Referring to FIG. 11, a pixel defining layer 475 may be formed on the insulation layer 465 to cover the first electrode 470a and the upper electrode 470b. For example, the pixel defining layer 475 may be formed of photoresist, polyamide-based resin, polyimide-based resin, acryl-based resin, silicon compound, etc.

The pixel defining layer 475 may be partially removed to form a pixel opening that exposes a portion of the first electrode 470a. This pixel opening may be formed in the pixel region only.

An organic light emitting layer 480 may be formed on the portion of the first electrode 470a exposed by the pixel opening. The organic light emitting layer 480 may be obtained by sequentially stacking a hole injection layer (HIL), a hole transfer layer (HTL), an organic light emitting layer (EL), an electron transfer layer (ETL), an electron injection layer (EIL), etc on the exposed first electrode 470a. The organic light emitting layer 480 may be formed of a light emitting material for generating a red color of light, a green color of light or a blue color of light in accordance with the pixels of the organic light emitting display device. Alternatively, the organic light emitting layer 480 may be formed by stacking a plurality of materials for generating a red color of light, a green color of light and/or a blue color of light, thereby finally emitting a white color of light.

A second electrode 485 may be formed on the pixel defining layer 475 and the organic light emitting layer 480. For example, the second electrode 485 may be formed of a material having a transmittance or a reflectivity. Although it is not illustrated, an additional substrate, an encapsulation substrate and/or a window may be formed on the second electrode 485.

Figure 12:
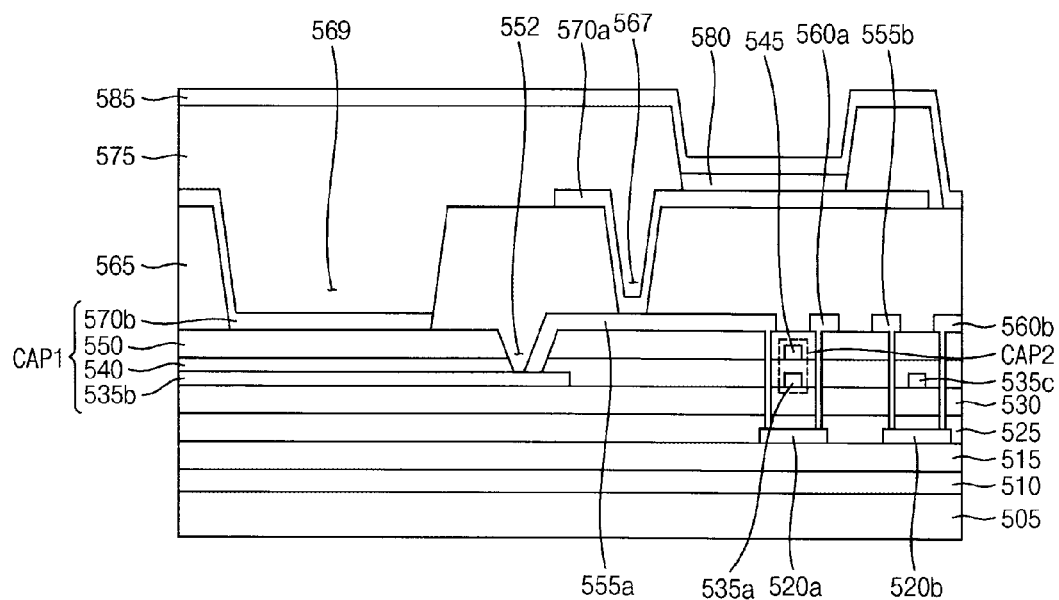
FIG. 12 is a cross sectional view illustrating an organic light emitting display device in accordance with some exemplary embodiments.

FIG. 12 is a cross sectional view illustrating an organic light emitting display device in accordance with some exemplary embodiments.

Referring to FIG. 12, an organic light emitting display device 500 may include a substrate 505, a first semiconductor device, a second semiconductor device, a first capacitor CAP1, an additional second capacitor CAP2, an organic light emitting structure, etc. In exemplary embodiments, the first capacitor CAP1 may be positioned in a transparent region of the organic light emitting display device 500, while the additional second capacitor CAP2 may be located in a pixel region of the organic light emitting display device 500. The organic light emitting structure may include a first electrode 570a, an organic light emitting layer 580 and a second electrode 585. Further, the first and the second semiconductor devices and the organic light emitting structure may be disposed in the pixel region.

The substrate 505 may include a transparent insulation substrate. The substrate 505 may also have the pixel and the transparent regions in accordance with the organic light emitting display device 500. A first buffer layer 510 and a second buffer layer 515 may be disposed on the substrate 505. Alternatively, the first buffer layer 510 and/or the second buffer layer 515 may be omitted the type and/or the material of the substrate 505.

The first and the second semiconductor devices may be disposed on the second buffer layer 515 in the pixel region. The first and the second semiconductor devices may include a first active pattern 520a and a second active pattern 520b, respectively. Each of the first and the second active patterns 520a and 520b may include material containing silicon or oxide semiconductor.

The first semiconductor device may include the first active pattern 520a, a first gate insulation layer 525, a second gate insulation layer 530, a first gate electrode 535a, a first source electrode 555a and a first drain electrode 560a. The second semiconductor device may include the second active pattern 520b, the first gate insulation layer 525, the second gate insulation layer 530, a second gate electrode 535c, a second source electrode 555b and a second drain electrode 560b. In this case, the first gate electrode 535a of the first semiconductor device may be located at a level over the substrate 505 substantially the same as that of the second gate electrode 535c of the second semiconductor device.

The first and the second active patterns 520a and 520b may be positioned on the second buffer layer 515, and the first gate insulation layer 525 may be disposed on the second buffer layer 515 to overlap the first and the second active patterns 520a and 520b. The second gate insulation layer 530 may be located on the first gate insulation layer 525. In some exemplary embodiments, the second gate insulation layer 530 may be omitted according to the material and/or the dimensions of the first gate insulation layer 525.

The first and the second gate electrodes 535a and 535c may be disposed on the second gate insulation layer 530 in the pixel region. In the transparent region, a first lower electrode 535b of the first capacitor CAP1 may be positioned on the second gate insulation layer 530. Each of the lower electrode 535b and first and the second gate electrodes 535a and 535c may include a material having a transmittance, a semi-transparent material or a material having a reflectivity. Further, the first capacitor CAP1 may have a first dielectric structure and a first upper electrode 570b. The first dielectric structure of the first capacitor CAP1 may include a first insulating interlayer 540 and a second insulating interlayer 550 in the transparent region.

The first insulating interlayer 540 may be disposed on the second gate insulation layer 530 to cover the first gate electrode 535a, the second gate electrode 535c and the first lower electrode 535b. In the pixel region, a second upper electrode 545 of the second capacitor CAP2 may be disposed on the first insulating interlayer 540. Here, the second upper electrode 545 may be generally referred to as an additional gate electrode. In exemplary embodiments, the additional second capacitor CAP2 may include the second upper electrode 545, a second dielectric structure and a second lower electrode. In this case, the second dielectric structure may be a portion of the first insulating interlayer 540 in the pixel region, and the second lower electrode may be the first gate electrode 535a of the first semiconductor device. In other words, the organic light emitting display device 500 may have a configuration in which the first semiconductor device and the additional capacitor CAP2 are substantially vertically stacked in the pixel region. For example, the first semiconductor device and the additional capacitor CAP2 may share the first gate electrode 535a so that the additional capacitor CAP2 may overlap with the first semiconductor device. When the organic light emitting display device 500 includes the additional capacitor CAP2, more sufficient capacitance may be provided for the first and the second semiconductor devices, the organic light emitting structure, other wrings, etc.

In exemplary embodiments, the first gate electrode 535a of the first semiconductor device (i.e., the second lower electrode of the additional capacitor CAP2), the second gate electrode 535c of the second semiconductor device and the first lower electrode 535b of the first capacitor CAP1 may be located at the substantially same level over the substrate 505. Further, the first upper electrode 570b of the first capacitor CAP1 and the second upper electrode 545 of the additional capacitor CAP2 may be positioned respectively at different levels over the substrate 505.

As described above, the additional capacitor CAP2 may be provided on the first semiconductor device such that the organic light emitting display device 500 including the additional capacitor CAP2 may have an improved integration degree without increasing the area of the pixel region. Furthermore, the first and the additional capacitors CAP1 and CAP2 may provide more sufficient capacitances for the elements of the organic light emitting display device 500.

Referring now to FIG. 12, the second insulating interlayer 550 may be disposed on the first insulating interlayer 540 to cover the second upper electrode 545. The first source electrode 555a and the first drain electrode 560a may make contact with a first source region and a first drain region of the first active pattern 520a through the second insulating interlayer 550, the first insulating interlayer 540, the second gate insulation layer 530 and the first gate insulation layer 525. Similarly, the second source electrode 555b and the second drain electrode 560b may make contact with a second source region and a second drain region of the second active pattern 520b through the second insulating interlayer 550, the first insulating interlayer 540, the second gate insulation layer 530 and the first gate insulation layer 525. Each of these electrodes 555a, 560a, 555b and 560b may include a material having a transmittance or a reflectivity.

The first source electrode 555a may extend into the transparent region. In the transparent region, the first and the second insulating interlayer 540 and 550 may have a first contact hole 552 that partially exposes the first lower electrode 535b. The first source electrode 555a may extend into the first contact hole 552 to thereby make contact with the first lower electrode 535b.

An insulation layer 565 may be disposed on the second insulating interlayer 550 to cover the first source and drain electrodes 555a and 560a and the second source and drain electrodes 555b and 560b. The insulation layer 565 may have a second contact hole 567 exposing an extended portion of the first source electrode 555a in the pixel region. Further, the insulation layer 565 may have an opening 569 exposing the second insulating interlayer 550 in the transparent region. The insulation layer 565 may include an organic material or an inorganic material, and may have a substantially planar upper face.

As illustrated in FIG. 12, the first electrode 570a and the first upper electrode 570b may be disposed on the insulation layer 565. The first electrode 570a may be located on the insulation layer 565, a sidewall of the second contact hole 567 and the exposed first source electrode 555a. The first upper electrode 570b may be positioned on the insulation layer 565 and the exposed second insulating interlayer 550. Each of the first electrode 570a and the first upper electrode 570b may include a material having a transmittance or a material having a reflectivity.

A pixel defining layer 575 may be disposed on the insulation layer 565, the first electrode 570a and the first upper electrode 570b. In the pixel region, the pixel defining layer 575 may have a pixel opening exposing a portion of the first electrode 570a. The organic light emitting layer 580 may be disposed on the exposed portion of the first electrode 570a in the pixel opening. The organic light emitting layer 580 may include a material for generating a red color of light, a green color of light or a blue color of light. Alternatively, the organic light emitting layer 580 may include a plurality of stacked materials for generating a white color of light.

The second electrode 585 may be disposed on the pixel defining layer 575 and the organic light emitting layer 580. The second electrode 585 may include a transparent material or a reflective material in accordance with the type of the organic light emitting display device 500. A transparent substrate, an encapsulation substrate and/or a window may be provided on the second electrode 585.

The organic light emitting display device 500 according to exemplary embodiments may include the first capacitor CAP1 in the transparent region and the additional capacitor CAP2 in the pixel region. Accordingly, these capacitors CAP1 and CAP2 may have more sufficiently capacitances for the first and the second semiconductor devices, the organic light emitting structure and other elements such as wirings. Further, the organic light emitting display device 500 may have an enhanced integration degree without increasing the area of the pixel region. Furthermore, when the first lower electrode 535b and/or the first upper electrode 570b may include a reflective material, the transparent region of the organic light emitting display device 500 may serve as a mirror.

Figure 13:
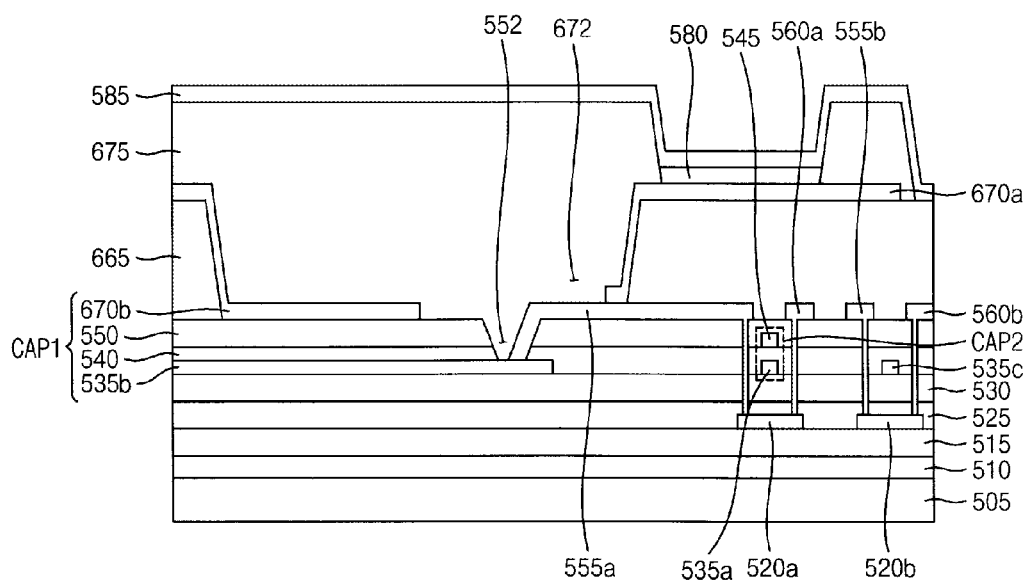
FIG. 13 is a cross sectional view illustrating an organic light emitting display device in accordance with some exemplary embodiments.

FIG. 13 is a cross sectional view illustrating an organic light emitting display device in accordance with some exemplary embodiments. In an organic light emitting display device 600 in FIG. 13, the same reference numerals are used for elements substantially the same as those of the organic light emitting display device 500 described with reference to FIG. 12.

Referring to FIG. 13, an insulation layer 665 may have an opening 672 that exposes an extended portion of a first source electrode 555a and the second insulating interlayer 550. The opening 672 of the insulation layer 665 may extend from the transparent region of the organic light emitting display device 600 to a portion of the pixel region. Since the organic light emitting display device 600 may include the opening 672 having a relatively large area without the second contact hole 567 illustrated in FIG. 12, the organic light emitting display device 600 may have a simple configuration. Further, the organic light emitting display device 600 may have a more increased transmittance when the insulation layer 665 includes the relatively large opening 672 in the transparent region.

A first electrode 670a of the organic light emitting structure may be disposed on one sidewall of the opening 672, the insulation layer 665 and an exposed portion of the first source electrode 555a in the pixel region. The first upper electrode 670b of a first capacitor CAP1 may be positioned on another sidewall of the opening 672, the insulation layer 665 and the second insulating interlayer 550 in the transparent region. The first electrode 670a and the first upper electrode 670a may be separated from each other. The first contact hole 552 where the first source electrode 555a contacts the first lower electrode 535b may be disposed between the first electrode 670a and the first upper electrode 670b. As described above, the first capacitor CAP1, which may be located in the transparent region, may include the first lower electrode 535b, the first dielectric structure (i.e., the portions of the first and the second insulating interlayers 540 and 550), and the first upper electrode 670b. The additional capacitor CAP2, which may be positioned in the pixel region, may include a second lower electrode (i.e., the first gate electrode 535a of the first semiconductor device), the second dielectric structure (i.e., the portion of the first insulating interlayer 540), and the second upper electrode 545.

Figure 14:
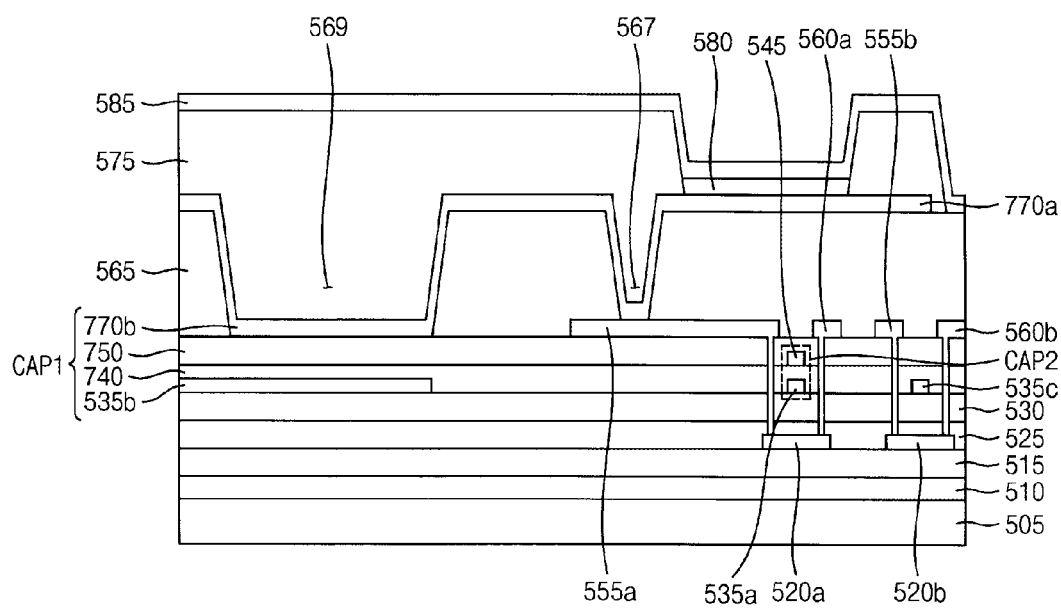
FIG. 14 is a cross sectional view illustrating an organic light emitting display device in accordance with some exemplary embodiments.

FIG. 14 is a cross sectional view illustrating an organic light emitting display device in accordance with some exemplary embodiments. In an organic light emitting display device 700 in FIG. 14, the same reference numerals are used for elements substantially the same as those of the organic light emitting display device 500 described with reference to FIG. 12.

Referring to FIG. 14, a first insulating interlayer 740 may be disposed on the second gate insulation layer 530 to cover the first gate electrode 535a of the first semiconductor device, the first lower electrode 535b of the first capacitor CAP1, and the second gate electrode 535c of the second semiconductor device. The second upper electrode 545 of the additional capacitor CAP2 may be positioned on the first insulating interlayer 740 corresponding to the first gate electrode 535a. The additional capacitor CAP2 may include the second lower electrode (i.e., the first gate electrode 535a), the second dielectric structure (i.e., a portion of the first insulating interlayer 740), and the second upper electrode 545.

A second insulating interlayer 750 may be disposed on the first insulating interlayer 740 to cover the second upper electrode 545. The first capacitor CAP1 may include, as described above, the first lower electrode 535b, a first dielectric structure (i.e., portions of the first and the second insulating interlayers 740 and 750), and a first upper electrode 770b in the transparent region.

The first source and drain electrodes 555a and 560a may make contact with the first source and drain regions of the first active pattern 520a, respectively, through the second insulating interlayer 750, the first insulating interlayer 740, the second gate insulation layer 530 and the first gate insulation layer 525. Additionally, the second source and drain electrodes 555b and 560b may make contact with the second source and drain regions of the second active pattern 520b, respectively, through the second insulating interlayer 750, the first insulating interlayer 740, the second gate insulation layer 530 and the first gate insulation layer 525. The first source electrode 755a may extend on the second insulating interlayer 750 toward the transparent region.

The insulation layer 565 may be disposed on the second insulating interlayer 750 to cover the first source and drain electrodes 555a and 560a and the second source and drain electrodes 555b and 560b. The insulation layer 565 may have a contact hole 567 exposing the extended portion of the first source electrode 555a in the pixel region, and also may have the opening 569 exposing a portion of the second insulating interlayer 750 in the transparent region.

The first electrode 770a of the organic light emitting structure and the first upper electrode 770b of the first capacitor CAP1 may be disposed on the insulation layer 565.

In exemplary embodiments, the first electrode 770a may be integrally formed with the first upper electrode 770b. The first electrode 770a and the first upper electrode 770b may be formed of the same material and in the same plane. The first upper electrode 770b in the transparent region may be positioned on the sidewall of the opening 569, the exposed portion of the second insulating interlayer 750 and the insulation layer 565. The first electrode 770a in the pixel region may be located on the sidewall of the contact hole 567, the exposed portion of the first source electrode 555a and the insulation layer 565. In the organic light emitting display device 700 illustrated in FIG. 14, the first contact hole 552 for connecting the first source electrode 555a and the first lower electrode 535b may not be provided and the first electrode 770a may be integrally formed with the first upper electrode 770b, so the organic light emitting display device 700 may have a simple configuration manufactured through simplified processes.

FIGS. 15 to 21 are cross sectional views illustrating a method for manufacturing an organic light emitting display device in accordance with some exemplary embodiments. The method illustrated in FIGS. 15 to 21 may provide an organic light emitting display device having a configuration substantially the same as or similar to that of the organic light emitting display device described 500 with reference to FIG. 12, however, the organic light emitting display device 600 or 700 illustrated in FIG. 13 or FIG. 14 may be manufactured by obviously modifying some processes such as a deposition process, an etching process, etc of the method illustrated in FIGS. 15 to 21.

Figure 15:
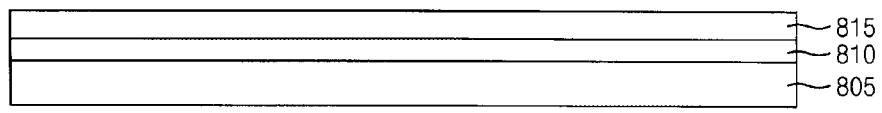
FIGS. 15, 16, 17, 18, 19, 20, and 21 are cross sectional views illustrating a method of manufacturing an organic light emitting display device in accordance with exemplary embodiments.

Referring to FIG. 15, a first buffer layer 810 and a second buffer layer 815 may be formed on a substrate 805 containing a transparent insulation material. Alternatively, a process for forming the first buffer layer 810 and/or a process for forming the second buffer layer 815 may be omitted in accordance with the ingredients of the substrate 805, the surface condition of the substrate 805, etc.

Figure 16:
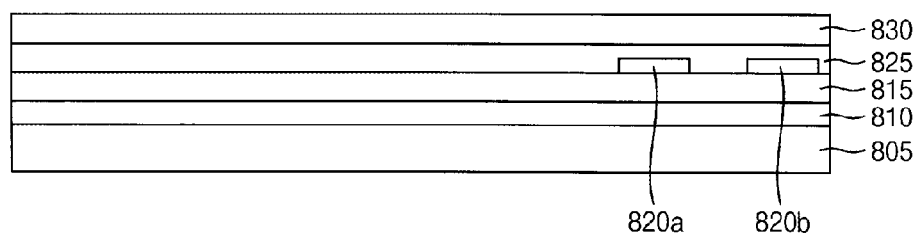

Referring to FIG. 16, a first active pattern 820a and a second active pattern 820b may be formed on the second buffer layer 815. Each of the first and the second active patterns 820a and 820b may be formed of a material containing silicon or oxide semiconductor. A first gate insulation layer 825 may be formed on the second buffer layer 815 to cover the first and the second active patterns 820a and 820b. A second gate insulation layer 830 may be formed on the first gate insulation layer 825. Alternatively, a process for forming the first gate insulation layer 825 or a process for forming the second gate insulation layer 830 may be omitted.

Figure 17:
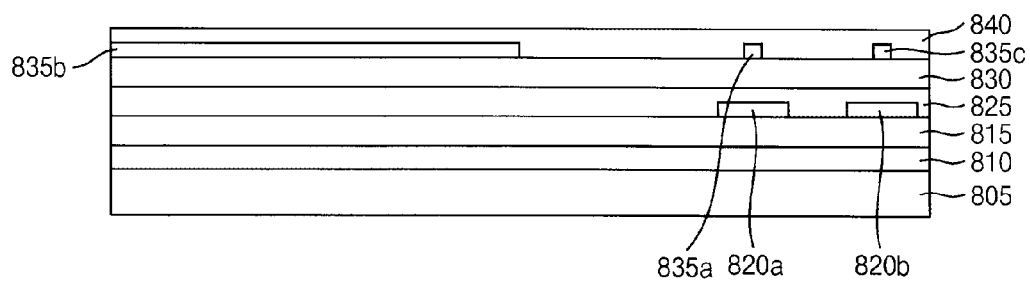

Referring to FIG. 17, a conductive layer (not illustrated) may be formed on the second gate insulation layer 830, and then the conductive layer may be patterned to form a first gate electrode 835a, a second electrode 835c and a first lower electrode 835b. The conductive layer may be formed of a transparent material, a reflective material or a semi-transparent material. The first gate electrode 835a, the first lower electrode 835b and the second gate electrode 835c may be obtained by an etching process using one etching mask. The first and the second electrodes 835a and 835c may be formed in a pixel region of the organic light emitting display device, and the first lower electrode 835b may be formed in a transparent region of the organic light emitting display device. A first insulating interlayer 840 may be formed on the second gate insulation layer 830 to cover the first and the second electrodes 835a and 835c and the first lower electrode 835b.

Figure 18:
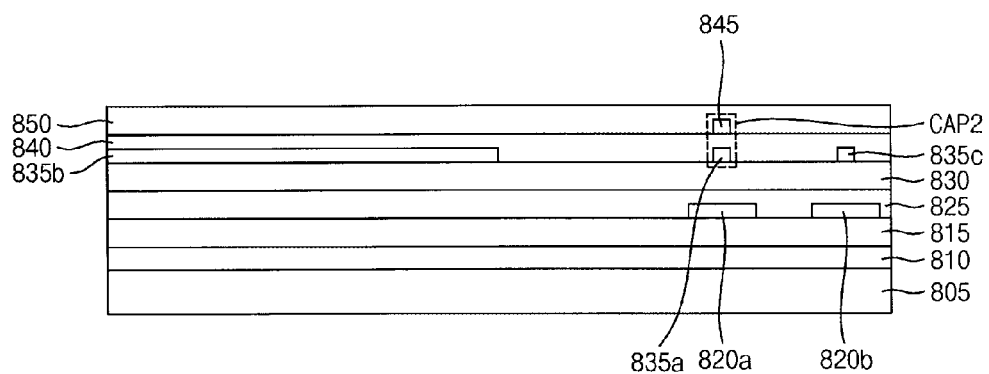

Referring to FIG. 18, a second upper electrode 845 may be formed on the first insulating interlayer 840. The second upper electrode 845 may be located on an area corresponding to the first gate electrode 835a, so that an additional capacitor CAP2 may be formed in the pixel region. The additional capacitor CAP2 may include the second upped electrode 845, a second dielectric structure (i.e., a portion of the first insulating interlayer 840) and a second lower electrode (i.e., the first gate electrode 835a of a first semiconductor device). A second insulating interlayer 850 may be formed on the first insulating interlayer 840 to cover the second upper electrode 845.

Figure 19:
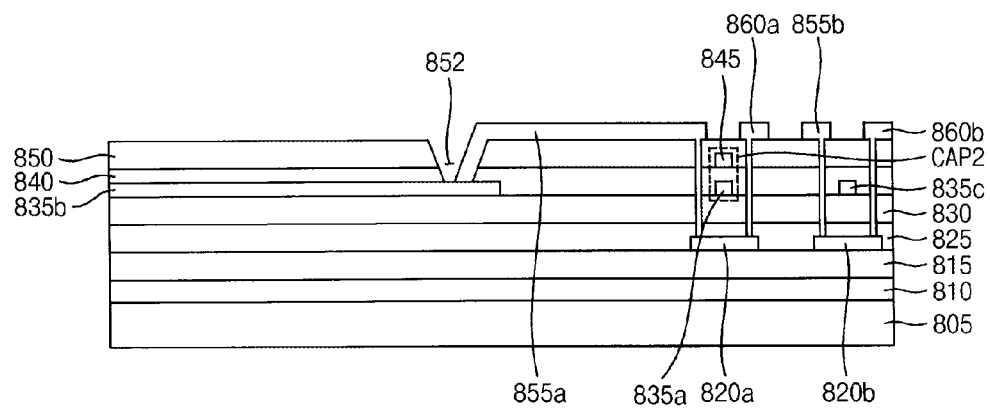

Referring to FIG. 19, the second insulating interlayer 850, the first insulating interlayer 840, the second gate insulation layer 830 and the first gate insulation layer 825 may be partially removed to form via holes that expose portions of the first and the second active patterns 820a and 820b, respectively. The via holes may expose a first source region and a first drain region of the first active pattern 820a, and a second source region and a second drain region of the second active pattern 820b. A first source electrode 855a, a first drain electrode 860a, a second source electrode 855b and a second drain electrode 860b may be formed on the second insulating interlayer 850 to fill the via holes. The first source and drain electrodes 855a and 860a may contact respectively the first source and drain regions of the first active pattern 820a, and the second source and drain electrodes 855b and 860b may contact the second source and drain regions of the second active pattern 820b.

In the transparent region, the second insulating interlayer 850 and the first insulating interlayer 840 may be partially removed to form a first contact hole 852 exposing a portion of the lower electrode 835b. For example, the via holes and the first contact hole 852 may be simultaneously formed by one etching process. The first source electrode 855a may extend onto the second insulating interlayer 850 and a sidewall of the first contact hole 852, so that the first source electrode 855a may make contact with the first lower electrode 835b.

Figure 20:
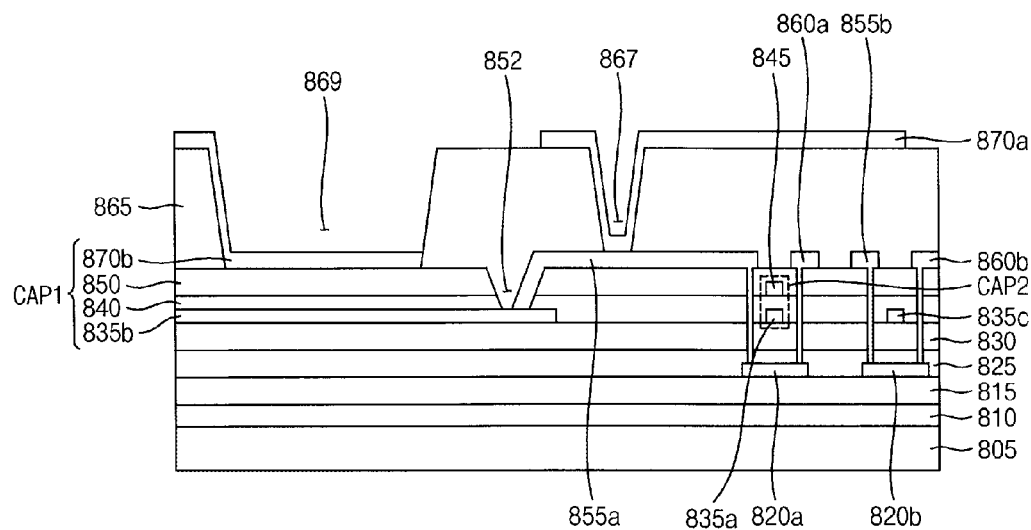

Referring to FIG. 20, an insulation layer 855 may be formed on the second insulating interlayer 850 to fill the first contact hole 852. The insulation layer 855 may cover the first source and drain electrodes 855a and 860a, and the second source and drain electrodes 855b and 860b. The insulation layer 865 may have a substantially planar surface for ease of forming of overlying structures. For example, the insulation layer 865 may be formed of an organic material or an inorganic material.

The insulation layer 865 may be partially etched to form a second contact hole 867 and an opening 869. The second contact hole 867 may expose the extended portion of the first source electrode 855a. The opening 869 may expose a portion of the second insulating interlayer 850. The second contact hole 867 and the opening 869 may be simultaneously formed in the pixel region and in the transparent region, respectively.

An electrode layer (not illustrated) may be formed on the insulation layer 865, the exposed second insulating interlayer 850 and the exposed portion of first source electrode 855a. The electrode layer may be patterned to form a first electrode 870a of an organic light emitting structure and a first upper electrode 870b of the first capacitor CAP1. In the pixel region, the first electrode 870a may be formed on the insulation layer 865, a sidewall of the second contact hole 867 and the extended portion of the first source electrode 855a. In the transparent region, the first upper electrode 870b may be formed on the insulation layer 865, a sidewall of the opening 869 and the exposed second insulating interlayer 850. For example, the electrode layer may be formed of a material having a transmittance or a material having a reflectivity.

Figure 21:
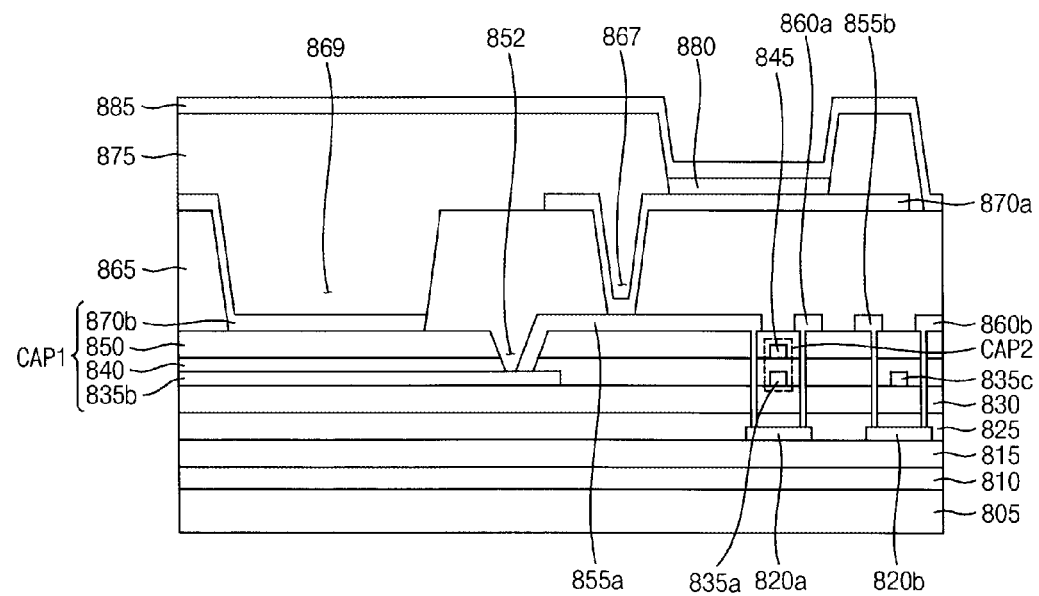

Referring to FIG. 21, a pixel defining layer 875 may be formed on the first electrode 870a, the first upper electrode 870b and the insulation layer 865 to fill the opening 869 and the second contact hole 867. The pixel defining layer 875 may be formed of an organic material or an inorganic material to have a substantially planar surface.

In the pixel region, the pixel defining layer 875 may be partially removed to form a pixel opening that exposes a portion of the first electrode 870a. An organic light emitting layer 880 may be formed on the exposed portion of the first electrode 870a in the pixel opening. A second electrode 885 may be formed on the pixel defining layer 875, a sidewall of the pixel opening and the organic light emitting layer 880. An additional substrate, an encapsulation substrate and/or a window may be formed on the second electrode 885.

According to exemplary embodiments of the inventive concept, a capacitor may be provided on a transparent region of an organic light emitting display device so that a sufficient capacitance for elements of the organic light emitting display device may be ensured without substantially reducing a transmittance of the organic light emitting display device. Additionally, the transparent region of the organic light emitting display device may serve as a mirror in accordance with the material included in a lower electrode of the capacitor and/or an upper electrode of the capacitor. Furthermore, the organic light emitting display device may include an additional capacitor in the pixel region such that the organic light emitting display device may have more sufficient capacitance of the element thereof without increasing an area of the pixel region.

The foregoing is illustrative of exemplary embodiments and is not to be construed as limiting the scope of the inventive concept. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device having a pixel region and a transparent region, which comprises:
    a substrate;
    at least one semiconductor device disposed on the substrate in the pixel region;
    an organic light emitting structure disposed on the at least one semiconductor device; and
    a capacitor disposed on the substrate in the transparent region.

2. The organic light emitting display device of claim 1, wherein the at least one semiconductor device comprises a first semiconductor device which includes a first active pattern disposed on the substrate, a first gate insulation layer disposed on the first active pattern, a first gate electrode disposed on the first gate insulation layer, a first source electrode contacting a first portion of the first active pattern and having an extended portion extending into the transparent region, and a first drain electrode contacting a second portion of the first active pattern.

3. The organic light emitting display device of claim 2, wherein the capacitor comprises a lower electrode contacting the extended portion of the first source electrode, a dielectric structure disposed on the lower electrode, and an upper electrode disposed on the dielectric structure.

4. The organic light emitting display device of claim 3, wherein the lower electrode and the first gate electrode are disposed on a same plane and formed of a same material.

5. The organic light emitting display device of claim 3, wherein each of the lower electrode and the upper electrode includes a material having a transmittance or a material having a reflectivity.

6. The organic light emitting display device of claim 3, wherein the dielectric structure includes a first insulating interlayer disposed on the first gate electrode and the lower electrode, and a second insulating interlayer disposed on the first insulating interlayer.

7. The organic light emitting display device of claim 3, further comprising an insulation layer disposed on the capacitor and the at least one semiconductor device, wherein the organic light emitting structure is positioned on the insulation layer,
wherein the insulation layer includes an opening exposing the dielectric structure in the transparent region and a contact hole exposing the extended portion of the first source electrode in the pixel region.

8. The organic light emitting display device of claim 7, wherein the upper electrode is disposed on the dielectric structure exposed by the opening, the insulation layer and a sidewall of the opening.

9. The organic light emitting display device of claim 7, wherein the organic light emitting structure includes a first electrode contacting the exposed portion of the first source electrode through the contact hole, an organic light emitting layer disposed on the first electrode, and a second electrode disposed on the organic light emitting layer, and
wherein the upper electrode is disposed on a same plane and formed of a same material with the first electrode.

10. The organic light emitting display device of claim 7, wherein the insulation layer has an opening exposing the exposed portion of the first source electrode and the dielectric structure.

11. The organic light emitting display device of claim 10, wherein the upper electrode is positioned on the insulation layer, one sidewall of the opening and the dielectric structure exposed by the opening.

12. The organic light emitting display device of claim 3, wherein the at least one semiconductor device comprises a second semiconductor device which includes a second active pattern disposed on the substrate, the first gate insulation layer disposed on the second active pattern, a second gate electrode disposed in the first gate insulation layer, a second source electrode contacting a first portion of the second active pattern, and a second drain electrode contacting a second portion of the second active pattern.

13. The organic light emitting display device of claim 12, wherein the second gate electrode and the lower electrode are positioned respectively at different levels over the substrate.

14. The organic light emitting display device of claim 3, further comprising an additional capacitor disposed in the pixel region.

15. The organic light emitting display device of claim 14, wherein the additional capacitor is disposed on the first semiconductor device.

16. The organic light emitting display device of claim 15, wherein the additional capacitor includes a lower electrode being the first gate electrode, a dielectric structure disposed on the first gate electrode, and an upper electrode disposed on the dielectric structure.

17. The organic light emitting display device of claim 16, wherein the dielectric structure of the additional capacitor includes an insulating interlayer disposed on the first gate electrode.

18. The organic light emitting display device of claim 2, wherein the capacitor comprises a lower electrode, a dielectric structure disposed on the lower electrode, and an upper electrode disposed on the dielectric structure and contacting the extended portion of the first source electrode.

19. The organic light emitting display device of claim 18, wherein the upper electrode is formed of a same material with an electrode of the organic light emitting structure.

20. The organic light emitting display device of claim 19, further comprising an additional capacitor disposed in the pixel region,
wherein the additional capacitor is disposed on the first semiconductor device,
wherein the additional capacitor includes a lower electrode being the first gate electrode, a dielectric structure disposed on the first gate electrode, and an upper electrode disposed on the dielectric structure, and
wherein the dielectric structure of the additional capacitor includes an insulating interlayer disposed on the first gate electrode.

* * * * *